(12) United States Patent
Choi

(10) Patent No.: US 10,840,308 B2
(45) Date of Patent: Nov. 17, 2020

(54) ORGANIC LIGHT-EMITTING DISPLAY

(71) Applicant: LG DISPLAY CO., LTD., Seoul (KR)

(72) Inventor: Howon Choi, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/151,518

(22) Filed: Oct. 4, 2018

(65) Prior Publication Data

US 2019/0131352 A1 May 2, 2019

(30) Foreign Application Priority Data

Nov. 2, 2017 (KR) .......................... 10-2017-0145441

(51) Int. Cl.
| | | |
|---|---|---|
| *H01L 27/32* | (2006.01) | |
| *H01L 51/50* | (2006.01) | |
| *G09G 3/3291* | (2016.01) | |
| *H01L 51/52* | (2006.01) | |
| *H01L 27/12* | (2006.01) | |

(52) U.S. Cl.
CPC ......... *H01L 27/322* (2013.01); *G09G 3/3291* (2013.01); *H01L 27/124* (2013.01); *H01L 27/1248* (2013.01); *H01L 27/326* (2013.01); *H01L 27/3211* (2013.01); *H01L 27/3213* (2013.01); *H01L 27/3218* (2013.01); *H01L 27/3246* (2013.01); *H01L 27/3258* (2013.01); *H01L 27/3262* (2013.01); *H01L 51/5036* (2013.01); *H01L 51/5212* (2013.01); *H01L 51/5228* (2013.01)

(58) Field of Classification Search
CPC . H01L 27/322; H01L 27/326; H01L 27/3258; H01L 27/3246; H01L 27/3218; H01L 27/3213; H01L 27/1248; H01L 51/5012; H01L 51/5212; H01L 51/5228; H01L 27/3262; H01L 27/3211; H01L 27/3248; H01L 27/124; H01L 51/5036; G09G 3/3291

See application file for complete search history.

(56) References Cited

U.S. PATENT DOCUMENTS 9,859,352 B2 * 1/2018 Kim .................. H01L 27/326
10,157,968 B2 * 12/2018 Park .................. H01L 27/3213
(Continued)

FOREIGN PATENT DOCUMENTS

| EP | 3 316 312 AQ | 5/2018 |
|---|---|---|
| KR | 20160069627 A | 6/2016 |

(Continued)

OTHER PUBLICATIONS

Search Report dated Apr. 1, 2019 issued in the corresponding European Patent Application No. 18191187.6, pp. 1-8.

*Primary Examiner* — Jasmine J Clark
(74) *Attorney, Agent, or Firm* — Polsinelli PC

(57) ABSTRACT

An organic light-emitting display comprises an overcoat layer disposed on a substrate, the overcoat layer having concave portion and convex portion disposed between neighboring concave portions, and an organic light-emitting diode and an auxiliary organic light-emitting diode disposed on the overcoat layer. A first electrode of the organic light-emitting diode is placed in the concave portion. An auxiliary electrode of the auxiliary organic light-emitting diode is placed on the convex portion.

19 Claims, 16 Drawing Sheets

(56) References Cited

U.S. PATENT DOCUMENTS

| | | | |
|---|---|---|---|
| 10,204,966 B2 * | 2/2019 | Choi | ............... H01L 51/102 |
| 2009/0206733 A1 | 8/2009 | Hwang et al. | |
| 2012/0001185 A1 | 1/2012 | Lee et al. | |
| 2013/0120981 A1 | 5/2013 | Kim et al. | |
| 2016/0343779 A1 | 11/2016 | Zhang et al. | |

FOREIGN PATENT DOCUMENTS

| | | |
|---|---|---|
| KR | 20170019510 A | 2/2017 |
| WO | 2016/165278 A1 | 10/2016 |

* cited by examiner

ORGANIC LIGHT-EMITTING DISPLAY

CROSS REFERENCE TO RELATED APPLICATION

This application claims the benefit of Korean Patent Application No. 10-2017-0145441, filed on Nov. 2, 2017, which is incorporated herein by reference in its entirety for all purposes as if fully set forth herein

BACKGROUND

Field of the Disclosure

The present disclosure relates to an organic light-emitting display.

Description of the Background

Recently, various display devices that are less bulky and lighter than cathode ray tubes (CRTs) are being developed. Examples of these display devices include liquid crystal displays (LCDs), field emission displays (FEDs), plasma display panels (PDPs), organic light-emitting display devices (OLEDs), etc.

Of these display devices, organic light-emitting displays are self-luminous displays that emit light through excitation of organic compounds. In contrast to LCDs, the organic light-emitting displays work without a backlight; thus, organic light-emitting displays can have light weight and thin profile and made through a simplified process. Also, the organic light emitting displays are widely used because they can be manufactured at low temperatures, have a fast response time of 1 ms or less, and feature low power consumption, wide viewing angle, and high contrast.

An organic light-emitting display includes pixels each having an organic light-emitting diode that converts electrical energy into light energy. The organic light-emitting diode comprises an anode, a cathode, and an organic emission layer situated between the anode and cathode. Holes and electrons are injected from the anode and cathode, respectively, and they recombine to form excitons, whereby the organic light-emitting display displays an image when the excitons decay from the excited state to the ground state.

Neighboring pixels can be defined by a bank (or pixel definition layer). The bank comprises apertures that respectively correspond to the pixels. Light generated from the organic light-emitting diode may be emitted through the aperture and become visible to the user. A region corresponding to the aperture may be defined as an emitting region, and the rest may be defined as a non-emitting region.

The apertures of the bank may cover the largest area possible in terms of process, because the area of the emitting region determines the aperture ratio. However, it is difficult to further reduce the non-emitting region compared to the current amount of area it covers, due to limitations on the process. Thus, it is necessary to propose a method for using a non-emitting region covering a certain amount of area for different purposes. Moreover, a large number of devices are required in a limited space in order to make a high-resolution organic light-emitting display with a high PPI (pixels per inch), so there is a need to find a way to improve space utilization.

SUMMARY

The present disclosure provides an organic light-emitting display that omits a conventional bank structure. Furthermore, the present disclosure provides an organic light-emitting display that makes effective use of the area conventionally allocated for the non-emitting region.

In one aspect, there is provided an organic light-emitting display comprising an overcoat layer disposed on a substrate, the overcoat layer having concave portion and convex portion disposed between neighboring concave portions, and an organic light-emitting diode and an auxiliary organic light-emitting diode disposed on the overcoat layer. A first electrode of the organic light-emitting diode is placed in the concave portion. An auxiliary electrode of the auxiliary organic light-emitting diode is placed on the convex portion.

The auxiliary electrode is a reflective electrode.

The organic light-emitting display further comprises an organic emission layer and a second electrode sequentially placed on the first electrode and the auxiliary electrode. The organic light-emitting diode and the auxiliary organic light-emitting diode share the organic emission layer and the second electrode.

The organic light-emitting display further comprises an opposing substrate facing the substrate, and a color filter arranged on the opposing substrate.

The organic light-emitting display further comprises a color filter disposed in the concave portion.

The organic light-emitting display further comprises a passivation layer interposed between the organic light-emitting diode and the color filter, the passivation covering the auxiliary organic light-emitting diode.

The organic light-emitting display further comprises a thin-film transistor disposed under the overcoat layer and connected to the first electrode via a first pixel contact hole penetrating the overcoat layer, and an auxiliary thin-film transistor disposed under the overcoat layer and connected to the auxiliary electrode via a second pixel contact hole penetrating the overcoat layer.

The first pixel contact hole overlaps the concave portion. The second pixel contact hole overlaps the convex portion.

The first electrode is a transmissive electrode. The auxiliary electrode is a reflective electrode.

The organic light-emitting display further comprises an upper color filter through which a part of a light provided from the organic light-emitting diode passes and a lower color filter facing the upper color filter, the lower color filter through which another part of the light provided from the organic light-emitting diode passes.

The auxiliary electrode comprises a transparent conductive material and a metal material that are sequentially stacked. The first electrode comprises the transparent conductive material.

In another aspect, there is provided an organic light-emitting display comprising pixels and auxiliary pixels that are separately defined by a step formed on an overcoat layer. The auxiliary pixel comprises an auxiliary electrode connected to an auxiliary thin-film transistor. The auxiliary electrode functions as one electrode of an auxiliary organic light-emitting diode when the auxiliary thin-film transistor is turned on, and functions as a reflective electrode to reflect an image of an object located in one direction when the auxiliary thin-film transistor is turned off.

The auxiliary pixel is driven separately from the pixels. A driving signal of the auxiliary pixel is different from the driving signal of the pixel.

BRIEF DESCRIPTION OF THE DRAWINGS

The accompanying drawings, which are included to provide a further understanding of the disclosure and are In the drawings.

DETAILED DESCRIPTION

Figure 1:
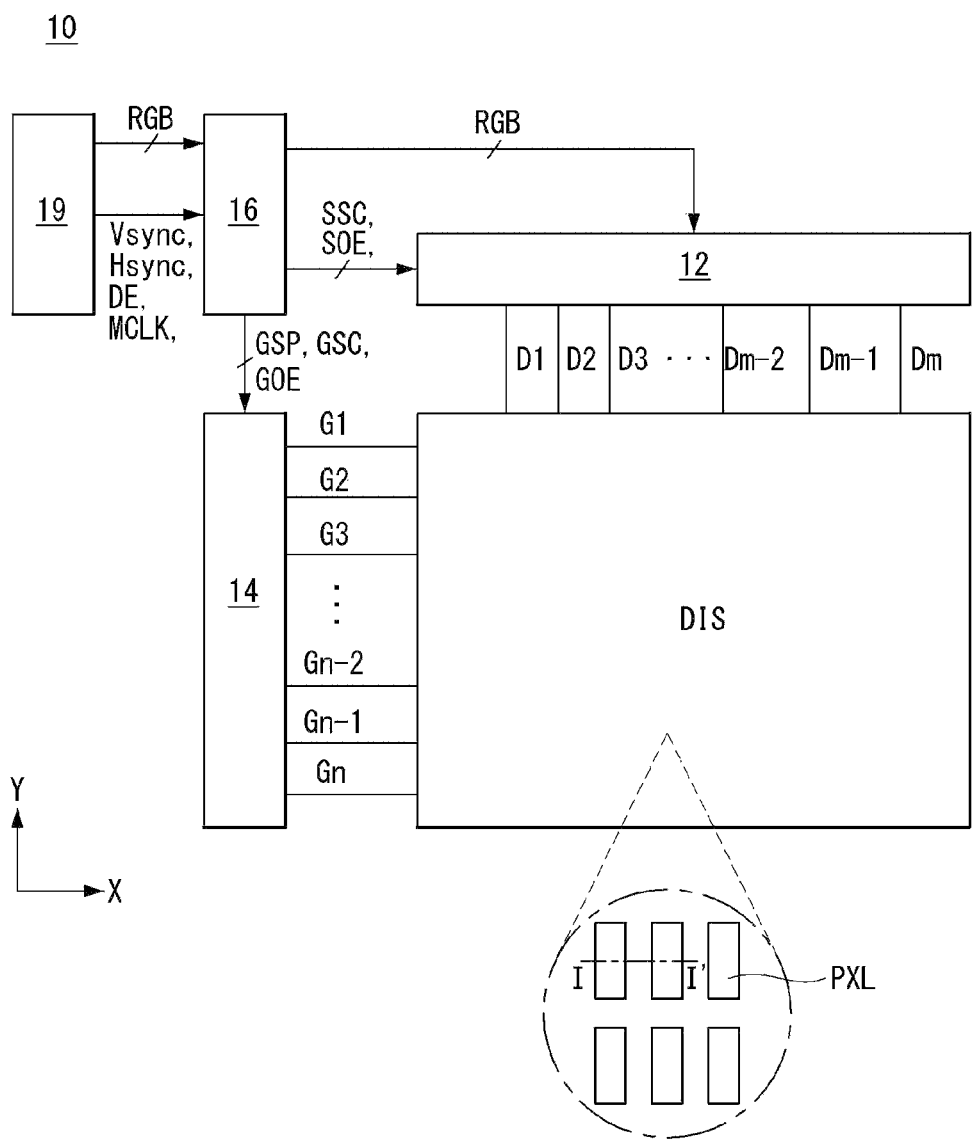
FIG. 1 is a block diagram schematically showing an organic light-emitting display.

Hereinafter, exemplary aspects of the present disclosure will be described in detail with reference to the attached drawings. Throughout the specification, like reference numerals denote substantially like components. In describing the present disclosure, a detailed description of known functions or configurations related to the present disclosure will be omitted when it is deemed that they may unnecessarily obscure the subject matter of the present disclosure. In describing various exemplary aspects, descriptions of the same or like components will be given in the beginning but omitted in other exemplary aspects.

Although terms including ordinal numbers such as "first" and "second" may be used to describe various components, the components are not limited by the terms. The terms are used only to distinguish one component from other components.

Figure 2:
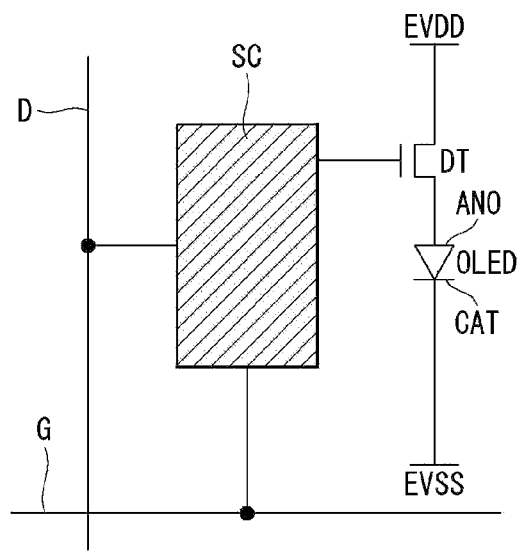
FIG. 2 is a circuit diagram schematically showing one of the pixels shown in FIG. 1.

FIG. 1 is a block diagram schematically showing an organic light-emitting display. FIG. 2 is a circuit diagram schematically showing one of the pixels shown in FIG. 1. FIG. 3 is diagrams showing concrete examples of FIG. 2

Referring to FIG. 1, the organic light-emitting display 10 according to the present disclosure comprises a display drive circuit and a display panel DIS.

The display drive circuit comprises a data drive circuit 12, a gate drive circuit 14, and a timing controller 16, and writes a video data voltage of an input image to pixels PIX on the display panel DIS. The data drive circuit 12 converts digital video data RGB received from the timing controller 16 to an analog gamma-compensated voltage and generates a data voltage. The data voltage outputted from the data drive circuit 12 is supplied to data lines D1 to Dm. The gate drive circuit 14 sequentially supplies a gate signal synchronized with the data voltage to gate lines G1 to Gn and selects pixels PIX from the display panel DIS to write the data voltage.

The timing controller 16 receives timing signals such as a vertical synchronization signal Vsync, a horizontal synchronization signal Hsync, a data enable signal DE, a main clock MCLK, etc. from a host system 19, and synchronizes the operation timings of the data drive circuit 12 and gate drive circuit 14. Data timing control signals for controlling the data drive circuit 12 comprise a source sampling clock SSC, a source output enable signal SOE, etc. Gate timing control signals for controlling the gate drive circuit 14 comprise a gate start pulse GSP, a gate shift clock GSC, a gate output enable signal GOE, etc.

The host system 19 may be implemented as any one of the following: a television system, a set-top box, a navigation system, a DVD player, a Blue-ray player, a personal computer PC, a home theater system, and a phone system. The host system 19 comprises a system-on-chip (SoC) with a scaler embedded in it, and converts digital video data RGB of an input image into a format suitable for display on the display panel DIS. The host system 19 transmits the timing signals Vsync, Hsync, DE, and MCLK, along with the digital video data, to the timing controller 16.

The display panel DIS may have various shapes. That is, the plane of the display panel DIS may be rectangular or square, and also may have various free-form shapes, such as a circle, an ellipse, or a polygon.

The display panel DIS comprises an active area having a plurality of pixels PXL. The pixels PXL may be defined by, but not limited to, the intersections of the data lines D1 to Dm (m is a positive integer) and the gate lines G1 to Gn (n is a positive integer). Each pixel PXL comprises an organic light-emitting diode which is a self-luminous element. The display panel DIS comprises red (R), blue (B), and green (G) pixels PXL that emit red (R), blue (B), and green (G) light.

Referring to FIG. 2, a plurality of data lines D and a plurality of gate lines G intersect on the display panel DIS, and pixels PXL are arranged in a matrix at the intersections. Each pixel PXL comprises an organic light-emitting diode OLED, a driving thin-film transistor DT that controls the amount of current flowing through the organic light-emitting diode OLED, and a programming part SC for setting the gate-source voltage of the driving thin-film transistor DT.

The programming part SC may comprise at least one switching thin-film transistor and at least one storage capacitor. The switching thin-film transistor turns on in response to a gate signal from a gate line G to apply a data voltage from a data line D to one electrode of the storage capacitor. The driving thin-film transistor DT adjusts the amount of light emitted from the organic light-emitting diode OLED by controlling the amount of current supplied to the organic light-emitting diode OLED depending on the level of voltage stored in the storage capacitor. The amount of light emitted from the organic light-emitting diode OLED is proportional to the amount of current supplied from the driving thin-film transistor DT. Such a pixel PXL is connected to a high-level voltage source Evdd and a low-level voltage source Evss to receive high-level power supply voltage and low-level power supply voltage from a power generating part (not shown). The thin-film transistors of the pixel PXL may be implemented as a p-type or an n-type. Moreover, semiconductor layers of the thin-film transistors of the pixel PXL may contain amorphous silicon, polysilicon, or oxide. A description will be given below with respect to a semiconductor layer that contains oxide. The organic light-emitting diode OLED comprises an anode ANO, a cathode CAT, and an organic emission layer sandwiched between the anode ANO and cathode CAT. The anode ANO is connected to the driving thin-film transistor DT.

Figure 3A:
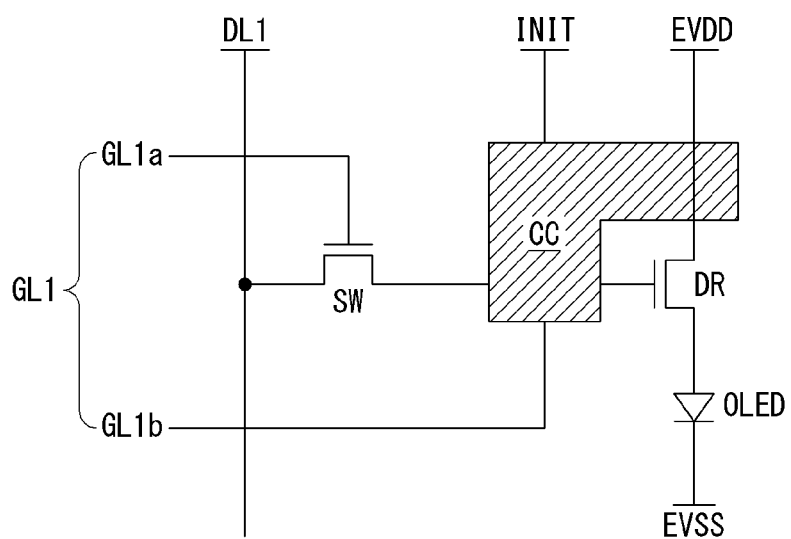
FIGS. 3A and 3B are diagrams showing concrete examples of FIG. 2.

As shown in FIG. 3A, a subpixel may comprise an internal compensation circuit CC, as well as the aforementioned switching transistor SW, driving transistor DR, capacitor Cst, and organic light-emitting diode OLED. The internal compensation circuit CC may comprise one or more transistors connected to a compensation signal line INIT. The internal compensation circuit CC sets the gate-source voltage of the driving transistor DR to a voltage that reflects variation in threshold voltage, so as to cancel out any brightness variation caused by the threshold voltage of the driving transistor DR when the organic light-emitting diode OLED emits light. In this case, the scan line GL1 comprises at least two scan lines GL1a and GL1b for controlling the switching transistor SW and the transistors in the internal compensation circuit CC.

Figure 3B:
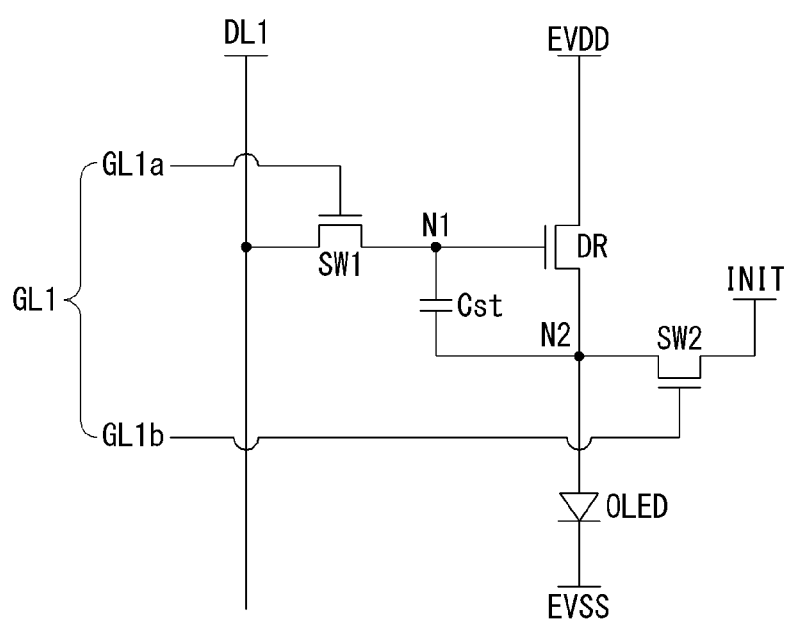

As shown in FIG. 3B, the subpixel may comprise a switching transistor SW1, a driving transistor DR, a sensing transistor SW2, a capacitor Cst, and an organic light-emitting diode OLED. The sensing transistor SW2 is a transistor that may be included in the internal compensation circuit CC, and performs a sensing operation for compensating for the subpixel.

The switching transistor SW1 serves to supply a data voltage supplied through the data line DL1 to a first node N1, in response to a scan signal supplied through the first scan line GL1a. The sensing transistor SW2 serves to reset or sense a second node N2 situated between the driving transistor DR and the organic light-emitting diode OLED, in response to a sensing signal supplied through the second scan line GL1b.

The structure of the subpixel according to the present disclosure is not limited to the above, but may vary, including 2T(transistor)1C(capacitor), 3T1C, 4T2C, 5T2C, 6T2C, and 7T2C.

First Exemplary Aspect

Figure 4:
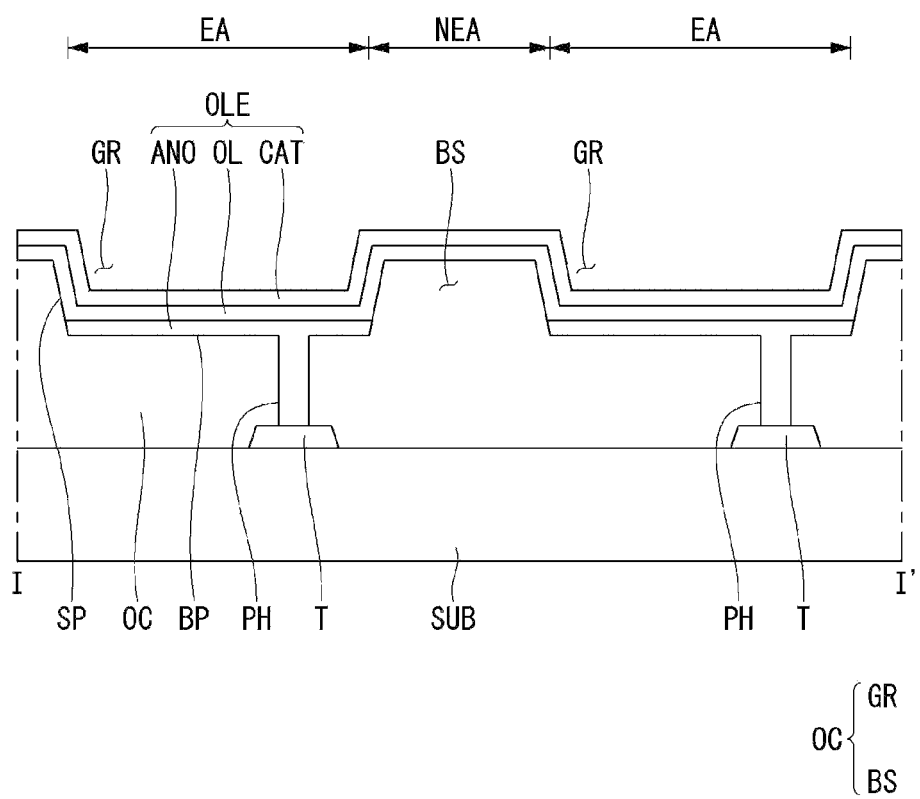
FIG. 4 is a cross-sectional view schematically showing a structure of two neighboring pixels in an organic light-emitting display according to a first exemplary aspect of the present disclosure.

FIG. 4 is a cross-sectional view schematically showing a structure of two neighboring pixels in an organic light-emitting display according to a first exemplary aspect of the present disclosure.

Referring to FIG. 4, the organic light-emitting display according to the first exemplary aspect of the present disclosure comprises a thin-film transistor substrate SUB. Thin-film transistors T respectively corresponding to the pixels and organic light-emitting diodes OLE connected to the thin-film transistors T are placed on the thin-film transistor substrate SUB. Although described later, neighboring pixels may be divided by convex portion BS of an overcoat layer OC.

The thin-film transistors T may have various structures, including a bottom-gate structure, a top-gate structure, and a double-gate structure. That is, each thin-film transistor T may comprise a semiconductor layer, a gate electrode, and source/drain electrodes, and the semiconductor layer, gate electrode, and source/drain electrodes may be arranged on different layers, with at least one insulating layer in between.

At least one insulating layer may be interposed between the thin-film transistor T and the organic light-emitting diode OLE. The insulating layer may comprise an overcoat layer OC made of an organic matter such as photoacryl, polyimide, benzocyclobutene resin, acrylate resin, etc. The overcoat layer OC may planarize the surface of the substrate SUB where the thin-film transistors T and various signal lines are formed. Although not shown, the insulating layer may further comprise a passivation layer composed of a silicon oxide film (SiOx), a silicon nitride film (SiNx), or multiple layers of them, and the passivation layer may be interposed between the overcoat layer OC and the thin-film transistors T. For convenience of explanation, the insulating layer will be described as comprising the overcoat layer OC alone, for example.

The overcoat layer OC comprises concave portions GR and convex portions BS. Each concave portion GR may be formed by partially recessing the top surface of the overcoat layer OC inward. Although described later, each concave portion GR is formed deep enough to receive the first electrode ANO of the organic light-emitting diode OLE. A region where a concave portion GR is formed may correspond to an emitting region EA. The emitting region EA is a region where light generated from the organic light-emitting diode OLE is emitted, which is distinct from a non-emitting region NEA which does not contribute to light emission. The shape of the concave portion GR may be defined by a bottom face BP and two side faces SP extending from the opposite edges of the bottom face BP.

The convex portions BS are formed between each neighboring concave portion GR. The convex portions BS are part of the overcoat layer OC left between each neighboring concave portion GR as the concave portions GR are formed at predetermined intervals on the overcoat layer OC. The convex portions BS may function as a pixel definition layer that defines neighboring pixels. A region where a convex portion BS is formed may correspond to a non-emitting region NEA.

The first exemplary aspect of the present disclosure allows for reducing the extra process time, cost, and defects coming from the addition of a process, because it does not require the formation of the pixel definition layer for defining neighboring pixels, and therefore has the advantage of significantly improving process yield.

Moreover, the first exemplary aspect of the present disclosure requires no additional process for aligning the pixel definition layer with specific positions on the overcoat layer OC, because no pixel definition layer is formed. The higher the pixels per inch (PPI) of a high-resolution display device, the narrower the pixel definition layer, which makes correct alignment difficult. In this regard, the present disclosure offers the advantages of significantly improving process yield and preventing any degradation of picture quality caused by bank misalignment.

The thin-film transistor T and the organic light-emitting diode OLE may be electrically connected via a pixel contact hole PH penetrating the overcoat layer OC. The pixel contact hole PH is formed under the concave portion GR and exposes at least part of the thin-film transistor T. Thus, the pixel contact hole PH is positioned to overlap the concave portion GR in a vertical direction (or up/down direction).

The organic light-emitting diode OLE comprises first and second electrodes ANO and CAT facing each other, and an organic emission layer OL interposed between the first electrode ANO and the second electrode CAT. The first electrode may be an anode, and the second electrode may be a cathode.

The first electrode ANO may be composed of a single layer or multiple layers. The first electrode ANO further comprises a reflective layer to function as a reflective electrode. The reflective layer may be made of aluminum (Al), copper (Cu), silver (Ag), nickel (Ni), or an alloy of these elements, or APC (silver/palladium/copper alloy). In an example, the first electrode ANO may be formed of triple layers of ITO(indium tin oxide)/Ag alloy/ITO. In this case, the lower ITO may be formed for the purpose of improving the adhesion between the overcoat layer OC and the Ag alloy.

The first electrodes ANO are allocated to each pixel—one for each pixel. Each of the first electrodes ANO is contained in the internal space of the corresponding concave portion GR. Thus, the first electrodes ANO may be correctly aligned with preset positions. A convex portion BS is located between neighboring first electrodes ANO. The neighboring first electrodes ANO may be aligned by the convex portion BS, a preset distance apart from each other in a horizontal direction (or left/right direction). As such, the first exemplary aspect of the present disclosure has the advantage of correctly aligning the first electrodes ANO with preset positions by using the concave portions GR and convex portions BS of the overcoat layer OC.

The second electrodes CAT may be made of a transparent conductive material such as ITO (indium tin oxide), IZO (indium zinc oxide), or ZnO (zinc oxide), or may be made of a thin opaque conductive material such as magnesium (Mg), calcium (Ca), aluminum (Al), or silver (Ag) and function as a transmissive electrode. The second electrodes CAT may be disposed to extend on the thin-film transistor substrate SUB in an integrated fashion so as to cover the pixels.

The organic emission layer OL is disposed to extend on the thin-film transistor substrate SUB so as to cover the pixels. The organic light-emitting display according to the present disclosure comprises an organic emission layer OL that emits white light (W) and red (R), green (G), and blue (B) color filters, in order to produce red (R), green (G), and blue (B) light. That is, white (W) light emitted from the organic emission layer OL passes through the red (R), green (G), and blue (B) color filters respectively corresponding to red (R), green (G), and blue (B) pixels PXL, thereby allowing the organic light-emitting display to produce red (R), green (G), and blue (B) light.

In the organic light-emitting display according to the present disclosure, the organic emission layer OL emitting white light (W) is made wide enough to cover most of the entire surface of the panel, so there is no need to use FMM to allocate red (R), blue (B), and green (G) organic emission layers OL to the corresponding pixels PXL, respectively. Thus, the present disclosure has the advantage of avoiding problems with the use of the aforementioned FMM—for example, a decrease in process yield associated with high resolution and an alignment error which causes displacement of the organic emission layer OL.

The organic emission layer OL that emits white light (W) may have a multi-stack structure such as a n-stack structure (n is an integer greater than or equal to 1). In an example, the two-stack structure may comprise a charge generation layer CGL situated between anode ANO and cathode CAT, and a first stack STC1 and a second stack STC2 that are located under and over the charge generation layer CGL sandwiched between them. The first stack STC1 and the second stack STC2 each comprise an emission layer, and may further comprise at least one of common layers such as a hole injection layer, a hole transport layer, an electron transport layer, and an electron injection layer. The emission layer of the first stack STC1 and the emission layer of the second stack STC2 may comprise light-emitting materials of different colors.

In another example, the organic emission layer OL that emits white light (W) may have a single-stack structure. The single stack comprises an emission layer EML, and may further comprise at least one of the above common layers.

Second Exemplary Aspect

Figure 5:
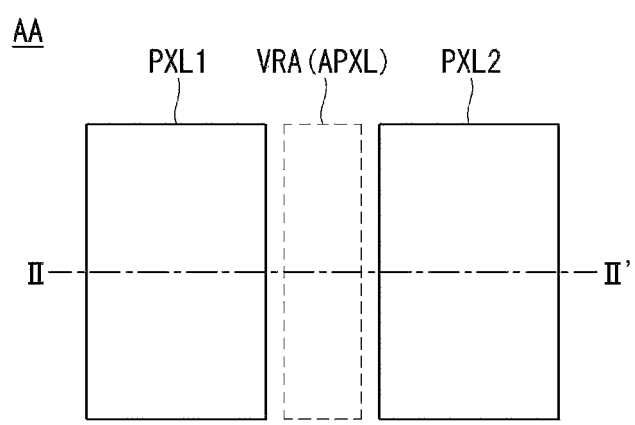
FIG. 5 is a plan view schematically showing an active region in an organic light-emitting display according to a second exemplary aspect of the present disclosure.
Figure 6:
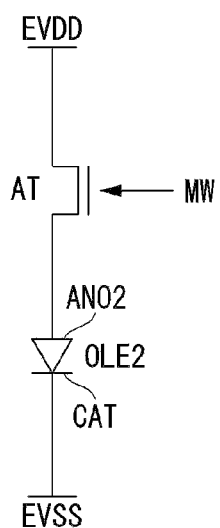
FIG. 6 is a circuit diagram schematically showing an auxiliary pixel in a variable region.
Figure 7A:
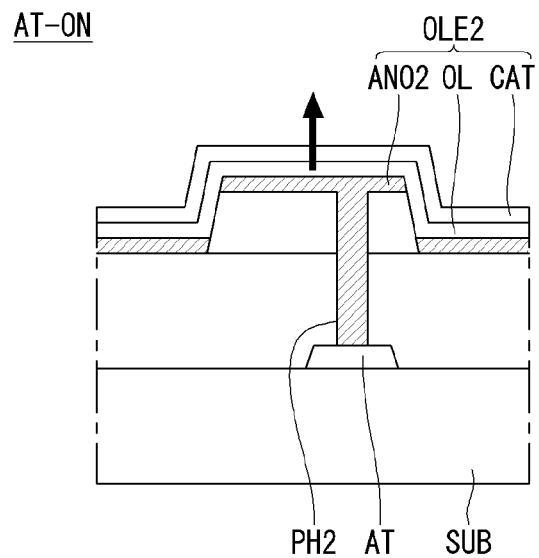
FIGS. 7A and 7B are schematic views for explaining an example of driving the auxiliary pixel.
Figure 7B:
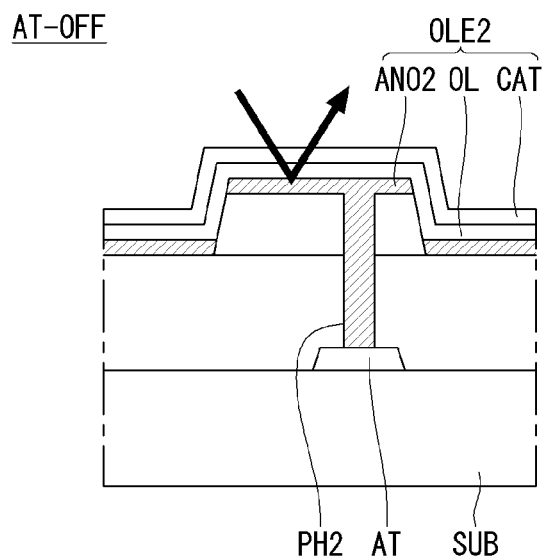
Figure 8:
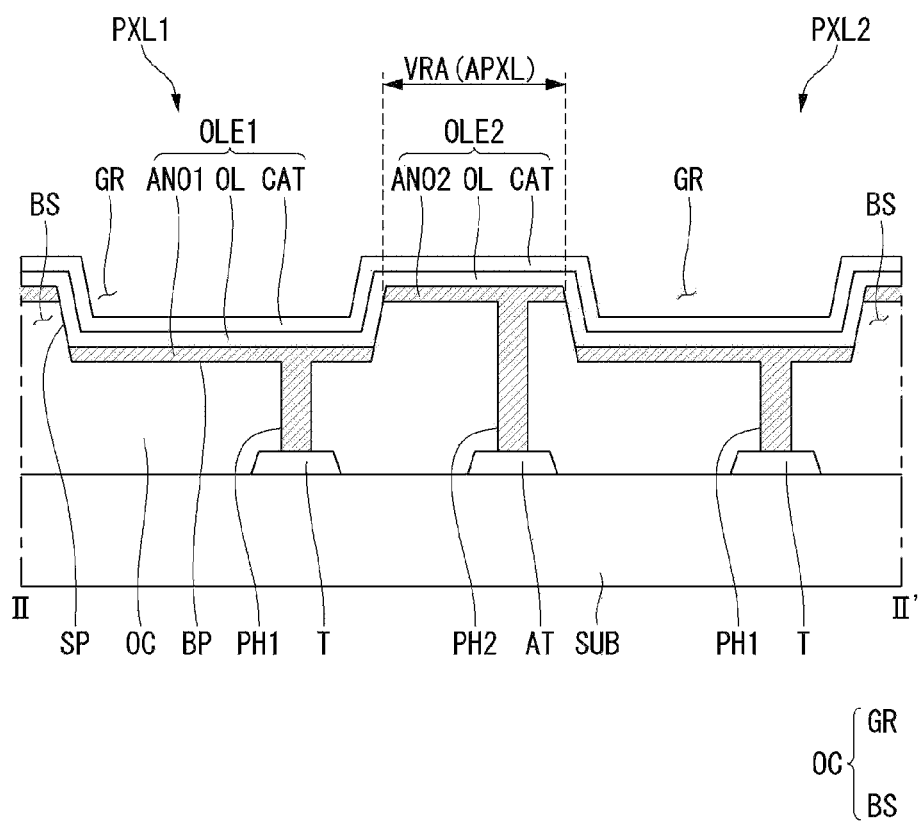
FIG. 8 is a cross-sectional view schematically showing a structure of two neighboring pixels in an organic light-emitting display according to the second exemplary aspect of the present disclosure.

FIG. 5 is a plan view schematically showing an active region in an organic light-emitting display according to a second exemplary aspect of the present disclosure. FIG. 6 is a circuit diagram schematically showing an auxiliary pixel in a variable region. FIGS. 7A and 7B are schematic views for explaining an example of driving the auxiliary pixel. FIG. 8 is a cross-sectional view schematically showing a structure of two neighboring pixels in an organic light-emitting display according to the second exemplary aspect of the present disclosure. In describing the second exemplary aspect, descriptions of parts substantially identical to those of the first exemplary aspect may be omitted.

Referring to FIG. 5, the organic light-emitting display according to the second exemplary aspect comprises an active region AA having a plurality of pixels PXL. Although the drawing illustrates that the pixels PXL take an approximately rectangular shape, for example, they are not limited to this shape. That is, the pixels PXL may have various shapes. For example, the pixels PXL may have various planar shapes such as circular, elliptical, and polygonal. One of the pixels PXL may have a different size and different planar shape from another. The planar shape of the pixels PXL may be determined by the planar shape of the concave portion GR.

A variable region VRA is defined in at least one area of the active region AA. The variable region VRA may be defined to correspond to a non-emitting region NEA (see FIG. 4) defined in the first exemplary aspect. That is, the variable region VRA may be defined in a selected area of the non-emitting region NEA (shown in FIG. 4) defined in the first exemplary aspect.

The variable region VRA comprises an auxiliary pixel APXL. In an example, as depicted in the drawing, the auxiliary pixel APXL may be located between a first pixel PXL1 and a second pixel PXL2 that neighbor each other. The auxiliary pixel APXL comprises an auxiliary thin-film transistor AT and an auxiliary organic light-emitting diode OLE2 connected to the auxiliary thin-film transistor AT. The auxiliary pixel APXL in the variable region VRA may be controlled by the auxiliary thin-film transistor AT, in a different way than the existing pixels PXL1 and PXL2. The auxiliary thin-film transistor AT may have the same structure as the thin-film transistors allocated to the existing pixels PXL1 and PXL2.

Referring to FIG. 6, by way of an example, the auxiliary pixel APXL comprises an auxiliary organic light-emitting diode OLE2 and an auxiliary thin-film transistor AT that switches the auxiliary organic light-emitting diode OLE2. The auxiliary organic light-emitting diode OLE2 comprises an auxiliary electrode ANO2, a second electrode CAT, and an organic emission layer situated between the auxiliary electrode ANO2 and the second electrode CAT. The auxiliary electrode ANO2 is connected to a high-level voltage source Evdd through the auxiliary thin-film transistor AT to receive high-level power supply voltage from a power generating part. The second electrode CAT is connected to a low-level voltage source Evss to receive low-level power supply voltage from the power generating part. The auxiliary thin-film transistor AT switches the current path between the auxiliary electrode ANO2 and the high-level voltage source Evdd, in response to an auxiliary control signal MW. The auxiliary thin-film transistor AT may connect the high-level voltage source Evdd to the auxiliary electrode ANO2 or cause it to float.

In another example, the structure of the auxiliary pixel APXL may be one of the following: 2T1C, 3T1C, 4T2C, 5T2C, 6T2C, and 7T2C, as depicted in FIG. 3B. Also, the auxiliary pixel APXL may have the same circuit structure as the existing pixels.

Referring to FIGS. 7A and 7B, when the auxiliary thin-film transistor AT is turned on (ON), the auxiliary anode ANO2 receives a high-level power supply voltage through a power supply path. In this case, the auxiliary organic light-emitting diode OLE2 maintains the ON state. When the auxiliary organic light-emitting diode OLE2 maintains the ON state, the auxiliary pixel APXL may function as a white pixel that emits white light, and this allows for full color representation along with red (R), green (G), and blue (B) light emitted from the existing pixels. The auxiliary electrode ANO2 may allow the white light to be directed forwards. Accordingly, the brightness of the emitted light may be improved, and power consumption may be reduced. Moreover, the auxiliary pixel APXL may be driven separately from the existing pixels and function as a white lighting part, because it may be selectively driven as necessary.

When the auxiliary thin-film transistor AT is turned off (OFF), the auxiliary electrode ANO2 goes into a floating state and is not able to receive the high-level power supply voltage EVDD. In this case, the auxiliary organic light-emitting diode OLE2 maintains the off state. When the auxiliary organic light-emitting diode OLE2 maintains the off state, the auxiliary electrode ANO2 may function as a mirror to reflect an image of an object located on the front of the organic light-emitting display. Thus, the organic light-emitting display according to the second exemplary aspect of the present disclosure may function as a mirror display. In the second exemplary aspect of the present disclosure, there is no need to add an additional reflecting member to make the mirror display work, unlike in the conventional art. Accordingly, the additional process for forming a reflecting member may be eliminated, and this may lead to benefits such as reducing the manufacturing time and cost associated with the process and reducing defects coming from the addition of a process, thereby allowing for a higher yield.

Referring to FIG. 8, the organic light-emitting display according to the second exemplary aspect of the present disclosure comprises a thin-film transistor substrate SUB. On the thin-film transistor substrate SUB, thin-film transistors T individually allocated to pixels PXL1 and PXL2 and organic light-emitting diodes OLE1 connected to the thin-film transistors T are placed, and auxiliary thin-film transistors AT allocated to auxiliary pixels APXL and auxiliary organic light-emitting diodes OLE2 connected to the auxiliary thin-film transistors AT are placed.

The pixels PXL1 and PXL2 and the auxiliary pixels APXL may be separately defined by a step formed on the overcoat layer OC. That is, the pixels PXL1 and PXL2 and the auxiliary pixels APXL may be defined by the difference in level between the concave portions GR and the convex portions BS. The neighboring pixels PXL1 and PXL2 may be defined by the convex portions BS of the overcoat layer OC.

The thin-film transistors T and the auxiliary thin-film transistors AT may have various structures, including a bottom-gate structure, a top-gate structure, and a double-gate structure. That is, each thin-film transistor T and AT may comprise a semiconductor layer, a gate electrode, and source/drain electrodes, and the semiconductor layer, gate electrode, and source/drain electrodes may be arranged on different layers, with at least one insulating layer in between. Moreover, the thin-film transistors T and the auxiliary thin-film transistors AT may be implemented in different structures.

At least one insulating layer may be interposed between the thin-film transistor T and the organic light-emitting diode OLE1 and between the auxiliary thin-film transistor AT and the auxiliary organic light-emitting diode OLE2. The insulating layer may comprise an overcoat layer OC made of an organic material such as photoacryl, polyimide, benzocyclobutene resin, acrylate resin, etc. The overcoat layer OC may planarize the surface of the substrate SUB where the thin-film transistors T and various signal lines are formed. Although not shown, the insulating layer may further comprise a passivation layer composed of a silicon oxide film (SiOx), a silicon nitride film (SiNx), or multiple layers of them, and the passivation layer may be interposed between the overcoat layer OC and the thin-film transistors T and AT. For convenience of explanation, the insulating layer will be described as comprising the overcoat layer OC alone, for example.

The overcoat layer OC comprises concave portions GR and convex portions BS. Each concave portion GR may be formed by partially recessing the top surface of the overcoat layer OC inward. Although described later, each concave portion GR is formed deep enough to receive the first electrode ANO1 of the organic light-emitting diode OLE1.

The convex portions BS are formed between each neighboring concave portion GR. The regions where the convex portions BS are located may be variable regions VRA. The convex portions BS are part of the overcoat layer OC left between each neighboring concave portion GR as the concave portions GR are formed at predetermined intervals on the overcoat layer OC.

The thin-film transistor T and the organic light-emitting diode OLE1 may be electrically connected via a first pixel contact hole PHI penetrating the overcoat layer OC. The first pixel contact hole PHI is formed under the concave portion GR and exposes at least part of the thin-film transistor T. Thus, the first pixel contact hole PHI is positioned to overlap the concave portion GR in a vertical direction (or up/down direction).

The auxiliary thin-film transistor AT and the auxiliary organic light-emitting diode OLE2 may be electrically connected via a second pixel contact hole PH2 penetrating the overcoat layer OC. The second pixel contact hole PH2 is formed under the convex portion BS and exposes at least part of the auxiliary thin-film transistor AT. Thus, the second pixel contact hole PH2 is positioned to overlap the convex portion BS in a vertical direction (or up/down direction).

The organic light-emitting diode OLE1 comprises first and second electrodes ANO1 and CAT facing each other, and an organic emission layer OL interposed between the first electrode ANO1 and the second electrode CAT. The auxiliary organic light-emitting diode OLE2 comprises an auxiliary electrode ANO2 and the second electrode CAT facing each other, and an organic emission layer OL interposed between the auxiliary electrode ANO2 and the second electrode CAT. The organic light-emitting diode OLE1 and the auxiliary organic light-emitting diode OLE2 may share the organic emission layer OL and the second electrode CAT.

More specifically, the first electrode ANO1 of the organic light-emitting diode OLE1 is placed in the concave portion GR. The first electrode ANO1 may be composed of a single layer or multiple layers. The first electrode ANO1 further comprises a reflective layer to function as a reflective electrode. The reflective layer forming the first electrode ANO1 may be made of aluminum (Al), copper (Cu), silver (Ag), nickel (Ni), or an alloy of these elements, or APC (silver/palladium/copper alloy). In an example, the first electrode ANO1 may be formed of triple layers of ITO/Ag alloy/ITO.

The auxiliary electrode ANO2 of the auxiliary organic light-emitting diode OLE2 is placed on the concave portion GR. That is, in the second exemplary aspect, the auxiliary electrode ANO2 of the auxiliary organic light-emitting diode OLE2 is formed in the region where the convex portion BS is formed, unlike in the first exemplary aspect. The auxiliary electrode ANO2 further comprises a reflective layer to function as a reflective electrode and a mirror. The reflective layer forming the second electrode ANO2 may be made of aluminum (Al), copper (Cu), silver (Ag), nickel (Ni), or an alloy of these elements, or APC (silver/palladium/copper alloy). In an example, the auxiliary electrode ANO2 may be formed of triple layers of ITO/Ag alloy/ITO.

The auxiliary electrode ANO2 may be formed of the same material through the same process as the first electrode ANO1 but is not limited to this. The first electrode ANO1 and the auxiliary electrode ANO2 may have different structures as necessary. In an example, the first electrode ANO1 may be formed of a stack structure of ITO/Ag alloy/ITO, and the auxiliary electrode ANO2 may be formed of a single-layer structure of Ag alloy.

The auxiliary electrode ANO2 is spaced a predetermined distance apart from the first electrode ANO1. That is, the first electrode ANO1 and the auxiliary electrode ANO2 may not be electrically connected but separated from each other and receive different signals. Thus, the auxiliary organic light-emitting diode OLE2 comprising the auxiliary electrode ANO2 and the organic light-emitting diode OLE1 comprising the first electrode ANO1 may be driven separately from each other.

The organic emission layer OL is disposed to extend on the first electrode ANO1 and the auxiliary electrode ANO2 so as to cover the pixels. The second electrodes CAT are disposed to extend on the organic emission layer OL so as to cover the pixels. The second electrodes CAT may be made of a transparent conductive material such as ITO (indium tin oxide), IZO (indium zinc oxide), or ZnO (zinc oxide), or may be made of a thin opaque conductive material such as magnesium (Mg), calcium (Ca), aluminum (Al), or silver (Ag) and function as a transmissive electrode.

In the second exemplary aspect of the present disclosure, the region where the convex portion BS is formed may be optionally used as an emitting region (or lighting part) and a mirror region, unlike in the first exemplary aspect in which the region where the convex portion BS is formed is defined as a non-emitting region NEA. Accordingly, the second exemplary aspect of the present disclosure may provide an organic light-emitting display that significantly improves space utilization.

Figure 9A:
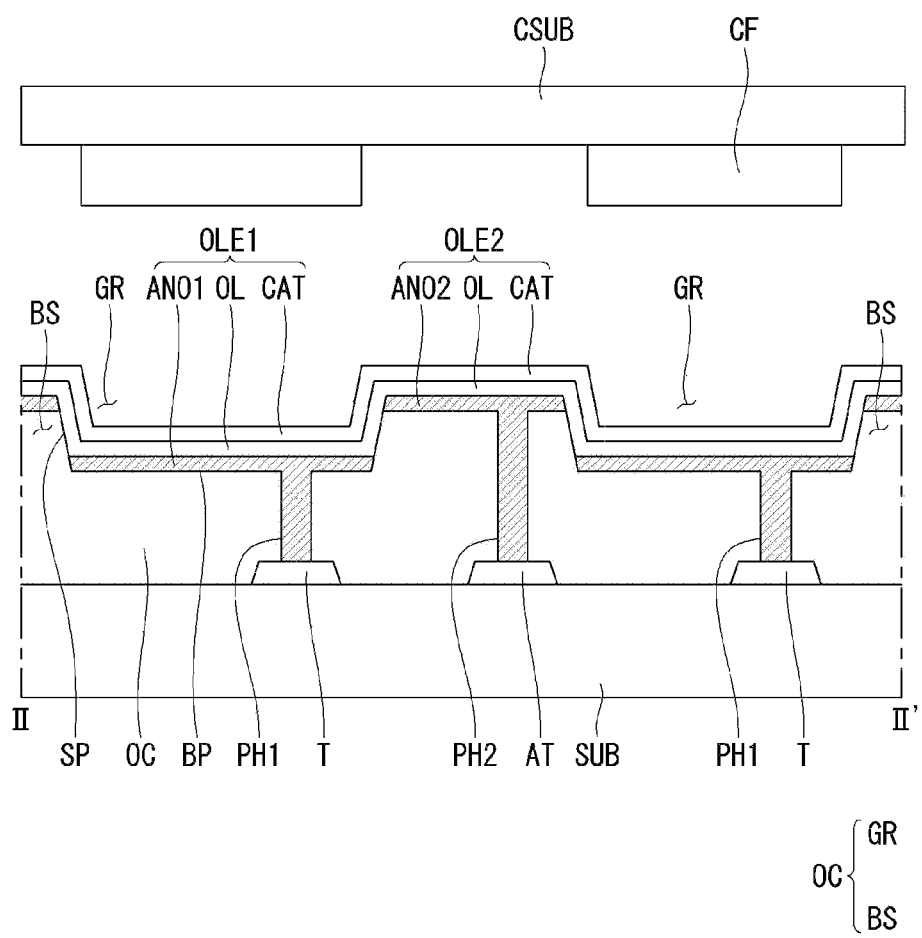
FIGS. 9A to 9C are views for explaining an example of the configuration of color filters.
Figure 9B:
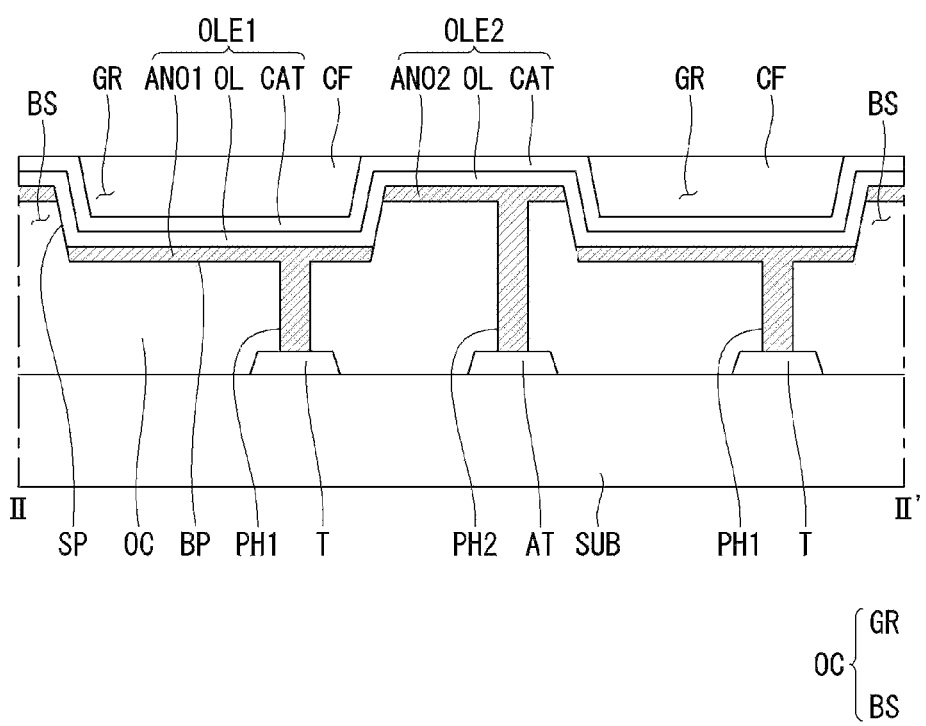
Figure 9C:
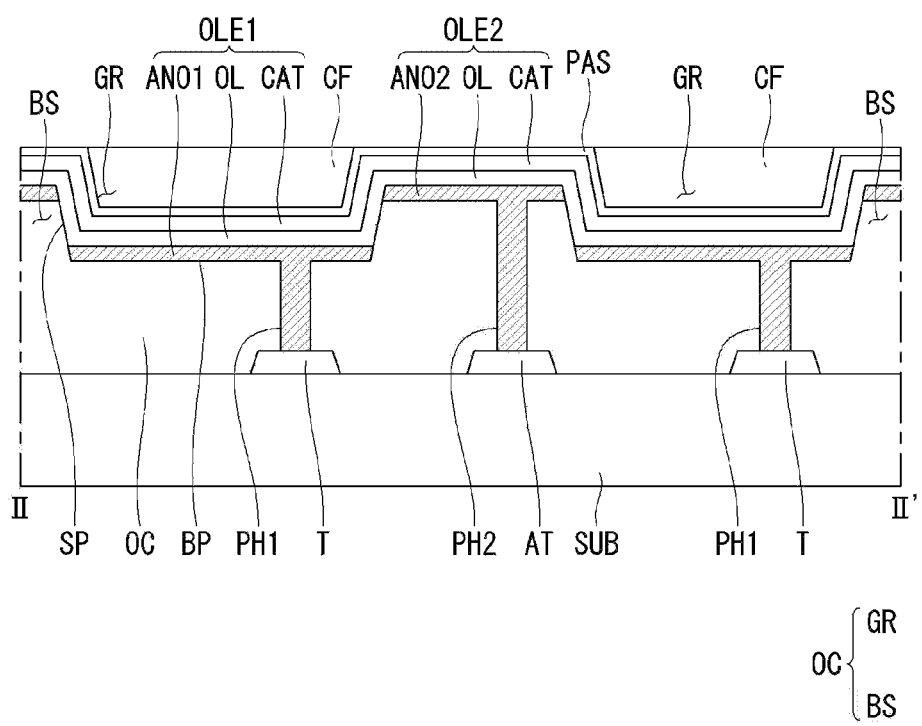

FIGS. 9A to 9C are views for explaining an example of the configuration of color filters.

Referring to FIG. 9A, color filters CF may be formed on an opposing substrate CSUB facing a substrate SUB. That is, the opposing substrate CSUB may be made of a transparent material to allow the light emitted from the organic light-emitting diode OLE to pass through. One color filter CF may be allocated to each pixel. The color filters CF may comprise red (R), green (G), and blue (B) color filters that let light of red (R), green (G), and blue (B) colors pass through. The red (R), green (G), and blue (B) color filter CF are allocated to the corresponding red (R), green (G), and blue (B) pixels. Although not shown, neighboring color filters CF may be defined by a black matrix formed on the opposing substrate CSUB. In this case, the white light emitted from the auxiliary organic light-emitting diode OLE2 on the convex portion BS may be visible to the user without passing through the color filters CF.

Referring to FIG. 9B, color filters CF may be formed on the organic light-emitting diodes OLE on the substrate SUB. In this case, the color filters CF are contained in the concave portions GR. The color filters CF may comprise red (R), green (G), and blue (B) color filters that let light of red (R), green (G), and blue (B) colors pass through. The red (R), green (G), and blue (B) color filter CF are allocated to the corresponding red (R), green (G), and blue (B) pixels.

The light provided from the organic light-emitting diode OLE1 passes through the color filter CF contained in the concave portion GR and is emitted. Since the color filter CF is contained in the concave portion GR, the light provided from the auxiliary organic light-emitting diode OLE2 on the convex portion BS is emitted without passing through the color filter CF.

Each of the color filters CF is contained in the internal space of the corresponding concave portion GR. Thus, the color filters CF may be correctly aligned with preset positions within the concave portions GR. A convex portion BS is located between neighboring color filters. The neighboring color filters CF may be aligned by the convex portion BS, a preset distance apart from each other in a horizontal direction (or left/right direction). That is, an exemplary aspect of the present disclosure has the advantage of correctly aligning the color filters CF with preset positions by using the concave portions GR and convex portions BS of the overcoat layer OC.

Referring to FIG. 9C, the organic light-emitting display may further comprise a passivation layer PAS that is interposed between the organic light-emitting diodes OLE1 and the color filters CF and covers the auxiliary organic light-emitting diodes OLE2. The passivation layer PAS may be made of an inorganic material such as a silicon oxide film (SiOx) or a silicon nitride film (SiNx).

By forming a passivation layer PAS on the second electrode CAT of the organic light-emitting diode OLE1, it is possible to minimize the problem of deterioration caused when the organic light-emitting diode OLE1 and the auxiliary organic light-emitting diode OLE2 are exposed to an environment in which the process of forming the color filters CF is performed. Moreover, the formation of the passivation layer PAS allows for effectively blocking impurities from entering the organic light-emitting diode OLE1 and the auxiliary organic light-emitting diode OLE2, thereby offering the advantage of preventing deterioration of the lifetime and brightness of the organic light-emitting diode OLE1 and auxiliary organic light-emitting diode OLE2. Another advantage of the passivation layer PAS is to effectively buffer (or alleviate) stress. Accordingly, it is possible to prevent cracks on the second electrode CAT which is brittle, and to block oxygen and moisture from entering through the cracks.

Figure 10A:
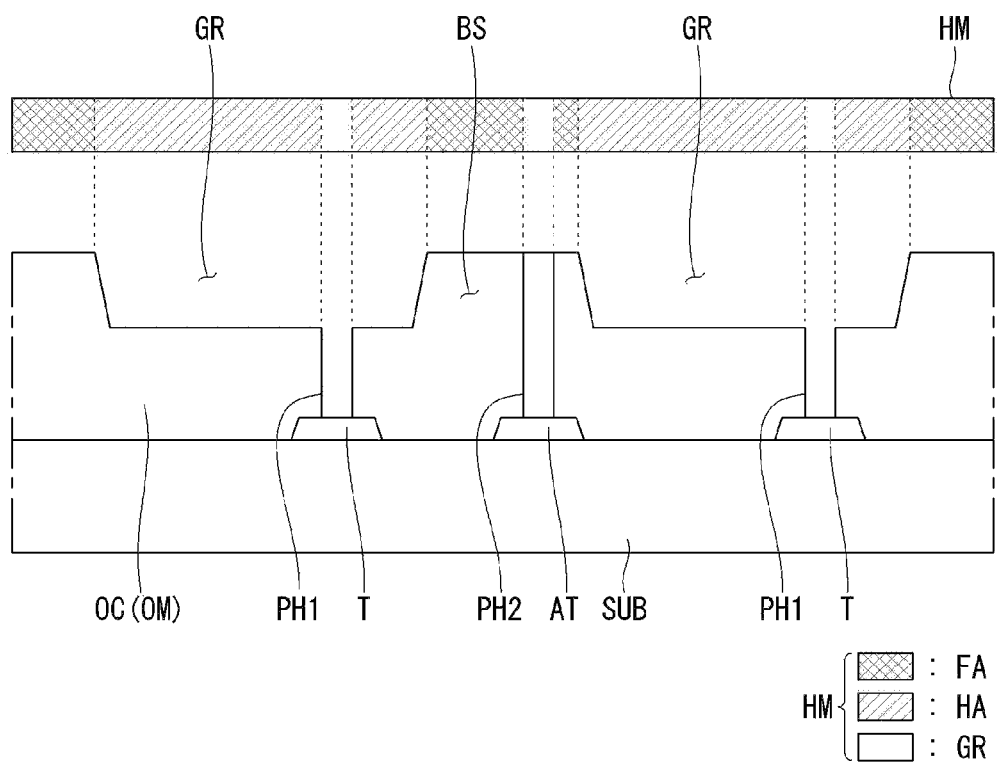
FIGS. 10A to 10C are views chronologically showing a manufacturing method according to the second exemplary aspect of the present disclosure.
Figure 10B:
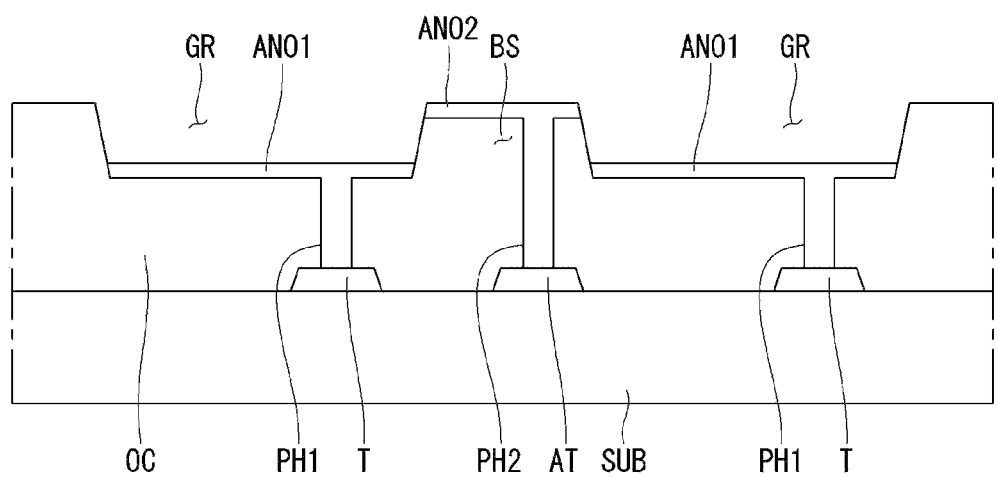
Figure 10C:
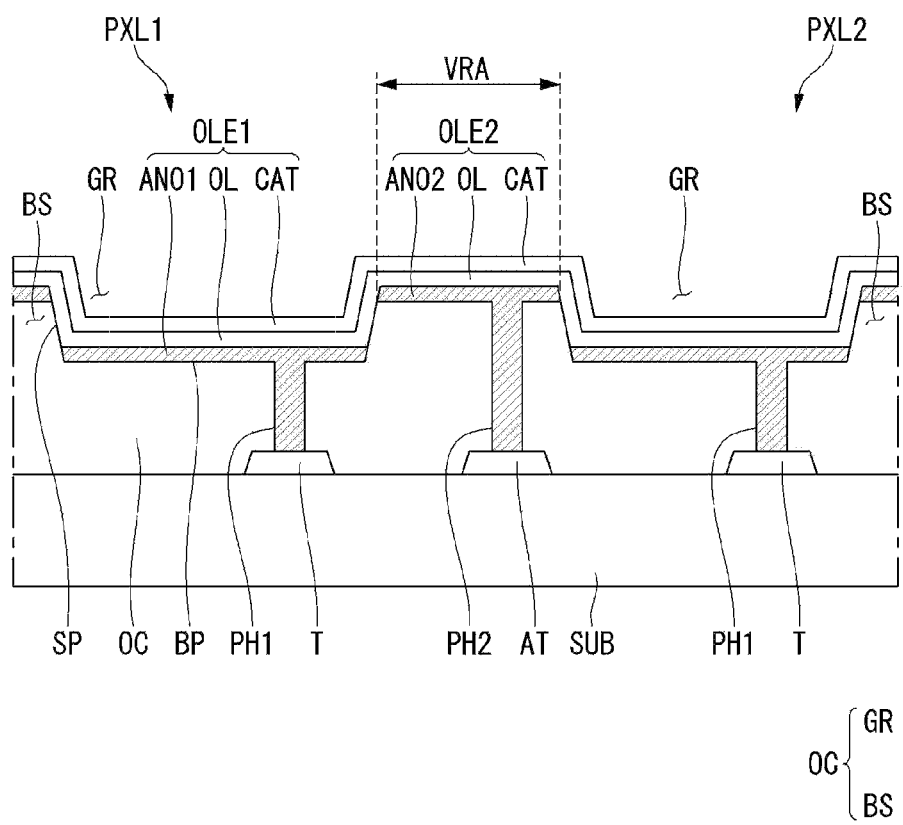

Hereinafter, referring to FIGS. 10A to 10C, a method for manufacturing an organic light-emitting display according to the second exemplary aspect of the present disclosure will be described. FIGS. 10A to 10C are views chronologically showing a manufacturing method according to the second exemplary aspect of the present disclosure. In describing the manufacturing method according to the present disclosure, it should be noted that, although the manufacturing method is divided into discrete steps, the steps may be subdivided. Also, the following description will be given only of the process of forming the overcoat layer OC, the organic light-emitting diodes OLE1 on the overcoat layer OC, and the auxiliary organic light-emitting diodes OLE2, which is an essential feature of the present disclosure.

Referring to FIG. 10A, an organic insulating material OM is disposed onto the substrate SUB where the thin-film transistors T and the auxiliary thin-film transistors AT are formed. The organic insulating material OM may be a positive type photoresist material. In a mask process, a half-tone mask HM is prepared to pattern the organic insulating material. The half-tone mask HM comprises a full-tone area FA for blocking all of the light projected thereto, a half-tone area HA for transmitting a part of the light projected thereto and blocking some thereof, and a transmissive area GA for transmitting all of the light projected thereto. Subsequently, light is selectively projected through the prepared half-tone mask HM.

When the organic insulating material OM exposed through the half-tone mask is developed, the organic insulating material OM in the transmissive area GA is removed and the organic insulating material OM in the full-tone area FA and half-tone area HA remain. In this case, the organic insulating material OM in the full-tone area FA is made thicker than the organic insulating material OM in the half-tone mask HA.

Spaces formed by removing the organic insulating material OM in the transmissive area GA serve as a first pixel contact hole PHI and a second pixel contact hole PH2. The first pixel contact hole PHI exposes at least part of the thin-film transistor T, and the second pixel contact hole PH2 exposes at least part of the auxiliary thin-film transistor AT. The organic insulating material OM left in the full-tone area FA and half-tone area HA serves as the overcoat layer OC. In this case, concave portions GR and convex portions BS are formed due to the thickness difference between the organic insulating material OM in the full-tone area FA and the organic insulating material OM in the half-tone mask HA. Each concave portion GR is an internal space formed by partially recessing the top surface of the overcoat layer OC inward. The convex portions BS are formed between each neighboring concave portion GR. The convex portions BS are part of the overcoat layer OC left between each neighboring concave portion GR as the concave portions GR are formed at predetermined intervals on the overcoat layer OC. The concave portions GR may correspond to the half-tone mask HA, and the convex portions BS may correspond to the full-tone area FA. The convex portions BS of the overcoat layer BS may function as a pixel definition layer that defines neighboring pixels. Accordingly, an exemplary aspect of the present disclosure allows for reducing the extra process time, cost, and defects coming from the addition of a process, because it does not require any additional process for forming the pixel definition layer, and therefore has the advantage of significantly improving process yield.

Referring to FIG. 10B, a conductive material is disposed onto the substrate SUB where the overcoat layer OC is formed. By patterning the conductive material in the mask process, the first electrode ANO1 is formed in the concave portion GR, and the auxiliary electrode ANO2 is formed on the convex portion BS. The first electrode ANO1 and the auxiliary electrode ANO2 are located separately, a predetermined distance apart from each other. The first electrode ANO1 is connected to the thin-film transistor T via the first pixel contact hole PH1 penetrating the overcoat layer OC. The auxiliary electrode ANO2 is connected to the auxiliary thin-film transistor AT via the second pixel contact hole PH2 penetrating the overcoat layer OC.

Since the first pixel contact hole PH1 is an element for connecting the thin-film transistor T and the first electrode ANO1 contained in the concave portion GR, it overlaps the concave portion GR in a vertically direction. Since the second pixel contact hole PH2 is an element for connecting the auxiliary thin-film transistor AT and the auxiliary electrode ANO2 formed on the convex portion BS, it overlaps the convex portion BS in a vertical direction.

Referring to FIG. 10C, the organic emission layer OL and the second electrode CAT are sequentially formed on the substrate SUB where the first electrode ANO1 is formed. As a result, an organic light-emitting diode OLE1 comprising the first electrode ANO1, organic emission layer OL, and second electrode CAT and an auxiliary organic light-emitting diode OLE2 comprising the auxiliary electrode ANO2, organic emission layer OL, and second electrode CAT are completed. As shown in the drawing, the organic light-emitting diode OLE1 and the auxiliary organic light-emitting diode OLE2 may share the organic emission layer OL and therefore reduce the number of processes.

Third Exemplary Aspect

Figure 11:
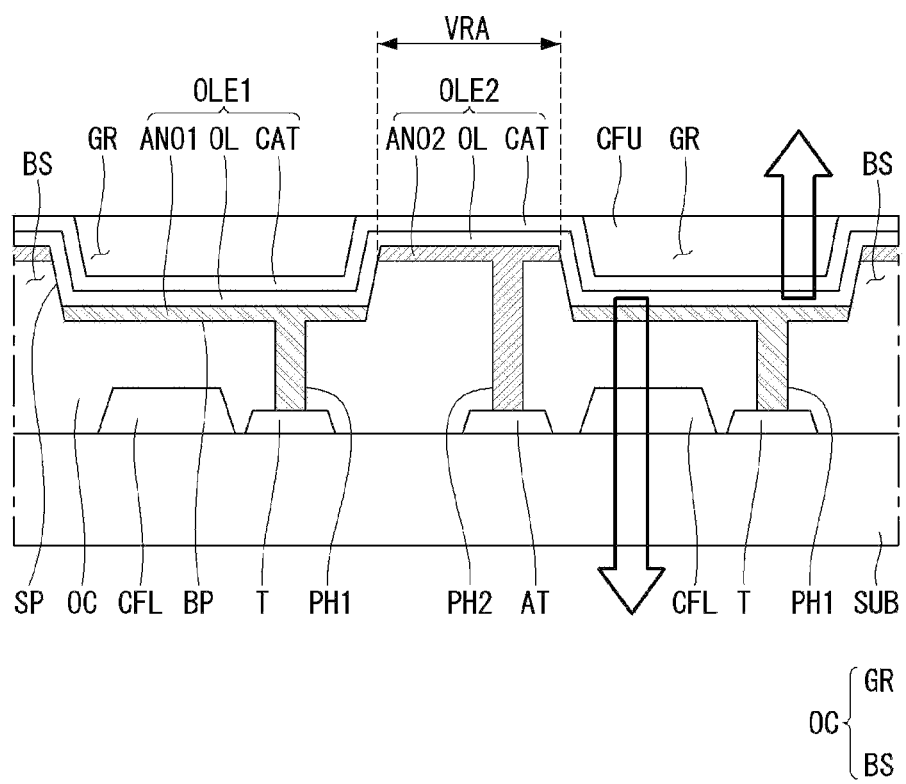
FIG. 11 is a cross-sectional view schematically showing a structure of two neighboring pixels in an organic light-emitting display according to a third exemplary aspect of the present disclosure.

FIG. 11 is a cross-sectional view schematically showing a structure of two neighboring pixels in an organic light-emitting display according to a third exemplary aspect of the present disclosure. In describing the third exemplary aspect, descriptions of parts substantially identical to those of the second exemplary aspect may be omitted.

The organic light-emitting display according to the third exemplary aspect of the present disclosure may be implemented as a double-sided light-emitting display. Referring to FIG. 11, the organic light-emitting display according to the third exemplary aspect of the present disclosure comprises a thin-film transistor substrate SUB. On the thin-film transistor substrate SUB, thin-film transistors T allocated to pixels PXL and organic light-emitting diodes OLE1 connected to the thin-film transistors T are placed, and auxiliary thin-film transistors AT allocated to auxiliary pixels APXL and auxiliary organic light-emitting diodes OLE2 connected to the auxiliary thin-film transistors AT are placed.

The organic light-emitting diode OLE1 comprises a first electrode ANO1, an organic emission layer OL, and a second electrode CAT. Unlike the second exemplary aspect, the first electrode ANO1 functions as a transmissive electrode. To this end, the first electrode ANO1 may be made of a transparent conductive material such as ITO.

The organic light-emitting display according to the third exemplary aspect of the present disclosure further comprises upper color filter CFU and lower color filters CFL. Each upper color filter CFU lets a part of the light coming from the organic light-emitting diode OLE1 pass through. Each lower color filter CFL is disposed to face the upper color filter CFU, with the organic light-emitting diode OLE1 in between, and lets another part of the light coming from the organic light-emitting diode OLE1 pass through.

More specifically, a part of the light generated from the organic emission layer OL may pass through the second electrode CAT and travel forwards and be visible to the user in front of the display device. As shown in the drawing, the light transmitted through the second electrode CAT represents the corresponding color by passing through the upper color filter CFU lying over the organic light-emitting diode OLE1. Another part of the light generated from the organic emission layer OL may pass through the first electrode ANO1 and travel backwards and be visible to the user behind the display device. As shown in the drawing, the light transmitted through the first electrode ANO1 represents the corresponding color by passing through the lower color filter CFU lying under the organic light-emitting diode OLE1.

The auxiliary organic light-emitting diode OLE2 comprises an auxiliary electrode ANO2, an organic emission layer OL, and a second electrode CAT. The auxiliary electrode ANO2 functions as a reflective electrode. Thus, the region where the auxiliary organic light-emitting diode OLE2 is allocated is a variable region VRA that has light-emission/lighting/mirror functions.

The auxiliary electrode ANO2 of the organic light emitting diode OLE2 and the first electrode ANO1 of the organic light-emitting diode OLE1 may be formed simultaneously through one process. For example, the auxiliary electrode ANO2 may comprise a transparent conductive material and a metal material and have a stack structure in which a transparent conductive layer and a reflective layer are stacked on top of each other, and the first electrode ANO1 may comprise a transparent conductive material forming the auxiliary electrode ANO2 and have a single-layer structure composed of the transparent conductive layer.

The organic light-emitting display according to the third exemplary aspect of the present disclosure may be implemented as a double-sided display device that displays image information in different directions. Accordingly, the organic light-emitting display according to the third exemplary aspect of the present disclosure may be easily applicable to a variety of display devices such as a public display, a private display, digital signage, etc.

The present disclosure has the advantage of omitting a pixel definition layer (or bank) formation process and a pixel definition layer alignment process by eliminating the conventional pixel definition layer structure. Moreover, the present disclosure may provide an organic light-emitting display which significantly improves space utilization by using the conventional non-emitting region as a variable region with light emission/lighting/mirror functions.

Through the above description, those skilled in the art will appreciate that various modifications and changes are possible, without departing from the scope and spirit of the disclosure. Therefore, the technical scope of the present disclosure should be defined by the appended claims rather than the detailed description of the specification.

What is claimed is:

1. An organic light-emitting display comprising:
   an overcoat layer disposed on a substrate and having a concave portion and a convex portion disposed between neighboring the concave portions, the concave portion formed by partially recessing a top surface of the overcoat layer inward; and
   an organic light-emitting diode and an auxiliary organic light-emitting diode disposed on the overcoat layer,
   wherein the organic light-emitting diode has a first electrode disposed in the concave portion, and the auxiliary organic light-emitting diode has an auxiliary electrode disposed on the convex portion.

2. The organic light-emitting display of claim 1, wherein the auxiliary electrode is a reflective electrode.

3. The organic light-emitting display of claim 1, further comprising an organic emission layer and a second electrode sequentially disposed on the first electrode and the auxiliary electrode,
   wherein the organic light-emitting diode and the auxiliary organic light-emitting diode share the organic emission layer and the second electrode.

4. The organic light-emitting display of claim 1, further comprising:
   an opposing substrate facing the substrate; and
   a color filter arranged on the opposing substrate.

5. The organic light-emitting display of claim 1, further comprising a color filter disposed in the concave portion.

6. The organic light-emitting display of claim 5, further comprising a passivation layer interposed between the organic light-emitting diode and the color filter, and covering the auxiliary organic light-emitting diode.

7. The organic light-emitting display of claim 1, further comprising:
   a thin-film transistor disposed under the overcoat layer and connected to the first electrode via a first pixel contact hole penetrating through the overcoat layer; and
   an auxiliary thin-film transistor disposed under the overcoat layer and connected to the auxiliary electrode via a second pixel contact hole penetrating through the overcoat layer.

8. The organic light-emitting display of claim 7, wherein the first pixel contact hole overlaps the concave portion, and the second pixel contact hole overlaps the convex portion.

9. The organic light-emitting display of claim 1, wherein the first electrode is configured to function as a transparent electrode to allow light to pass through, and
   wherein the auxiliary electrode is a reflective electrode.

10. The organic light-emitting display of claim 9, further comprising:
    an upper color filter through which a part of light emitted from the organic light-emitting diode passes; and
    a lower color filter through which another part of the light emitted from the organic light-emitting diode passes,
    wherein the upper color filter and the lower color filter are disposed to face each other with the organic light-emitting diode interposed therebetween.

11. The organic light-emitting display of claim 9, wherein the auxiliary electrode includes a transparent conductive material and a metal material that are sequentially stacked, and the first electrode includes the transparent conductive material.

12. An organic light-emitting display comprising:
    a plurality of pixels and a plurality of auxiliary pixels that are defined by a step formed by an overcoat layer,
    wherein the auxiliary pixel includes an auxiliary electrode connected to an auxiliary thin-film transistor, and
    wherein the auxiliary electrode is a reflective electrode.

13. An organic light-emitting display comprising:
    an overcoat layer disposed on a substrate and having a concave portion and a convex portion disposed between two neighboring the concave portions, the concave portion formed by partially recessing a top surface of the overcoat layer inward;
    an organic light-emitting diode having a first electrode in the concave portion, wherein the first electrode functions as a transparent electrode to allow light to pass through; and
    an auxiliary organic light-emitting diode having an auxiliary electrode disposed on the convex portion, wherein the auxiliary electrode functions as a reflective electrode.

14. The organic light-emitting display of claim 13, further comprising an upper color filter disposed on the organic light-emitting diode and the auxiliary organic light-emitting diode, and a lower color filter disposed on the substrate.

15. The organic light-emitting display of claim 14, wherein the upper color filter and the lower color filter face each other.

16. The organic light-emitting display of claim 13, wherein the plurality of auxiliary pixels is independently driven from the plurality of pixels.

17. The organic light-emitting display of claim 13, wherein a driving signal of the plurality of auxiliary pixels is different from a driving signal of the plurality of pixels.

18. The organic light-emitting display of claim 12, wherein the pixel includes a first electrode connected to a thin-film transistor, and
   wherein the auxiliary electrode and the first electrode are separated from each other.

19. The organic light-emitting display of claim 18, wherein a signal applied to the first electrode is different from a signal applied to the auxiliary electrode.

* * * * *